(12) United States Patent
Soda et al.

(10) Patent No.: US 7,994,635 B2
(45) Date of Patent: Aug. 9, 2011

(54) POWER SEMICONDUCTOR MODULE

(75) Inventors: Osamu Soda, Osaka (JP); Yuji Ohnishi, Osaka (JP); Kazunori Inami, Osaka (JP); Toshio Uchida, Osaka (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 97 days.

(21) Appl. No.: 12/451,157

(22) PCT Filed: May 18, 2007

(86) PCT No.: PCT/JP2007/060252
§ 371 (c)(1),
(2), (4) Date: Oct. 28, 2009

(87) PCT Pub. No.: WO2008/142760
PCT Pub. Date: Nov. 27, 2008

(65) Prior Publication Data
US 2010/0127387 A1    May 27, 2010

(51) Int. Cl.
*H01L 23/10* (2006.01)
*H01L 23/34* (2006.01)
(52) U.S. Cl. .................. 257/707; 257/691
(58) Field of Classification Search ............ 257/701, 257/691, 706, 707, 699
See application file for complete search history.

(56) References Cited

U.S. PATENT DOCUMENTS

| | | | | |
|---|---|---|---|---|
| 5,536,972 A * | 7/1996 | Kato | .............. | 257/706 |
| 6,166,904 A * | 12/2000 | Kitahara et al. | .............. | 361/697 |
| 7,081,670 B2 * | 7/2006 | Shibuya et al. | .............. | 257/707 |
| 2008/0074829 A1 * | 3/2008 | Kashiwazaki | .............. | 361/600 |

FOREIGN PATENT DOCUMENTS

| | | |
|---|---|---|
| JP | 09-237869 A | 9/1997 |
| JP | 10-84059 A | 3/1998 |
| JP | 2001-36005 A | 2/2001 |
| JP | 2003-031765 A | 1/2003 |
| JP | 2006-140401 A | 6/2006 |
| JP | 2006-332291 A | 12/2006 |

OTHER PUBLICATIONS

International Search Report mailed on Aug. 21, 2007.

* cited by examiner

*Primary Examiner* — S. V Clark
(74) *Attorney, Agent, or Firm* — Rader, Fishman & Grauer PLLC

(57) ABSTRACT

To suppress warpage of a ceramic substrate, and to prevent a reduction in radiation efficiency.

A power semiconductor module includes a module casing fitted with a radiator, and a common unit retained by the module casing. The common unit has: a ceramic substrate having a circuit surface disposed with a semiconductor element, and a radiation surface brought into abutting contact with the radiator; and a package formed by exposing the radiation surface and sealing the circuit surface with heat resistant resin. The circuit surface and the radiation surface are respectively formed of metal layers 51 formed on the ceramic substrate, and the metal layer 51 forming the radiation surface has: by forming a buffer pattern 512 including a groove part extending along a circumferential part thereof, a radiation pattern 510 formed on an inner side of the buffer pattern 512; and an outer peripheral pattern 511 formed on an outer side of the buffer pattern 512. Such a configuration enables warpage of the ceramic substrate to be suppressed, and a reduction in radiation efficiency to be prevented.

2 Claims, 12 Drawing Sheets

[Fig.1]
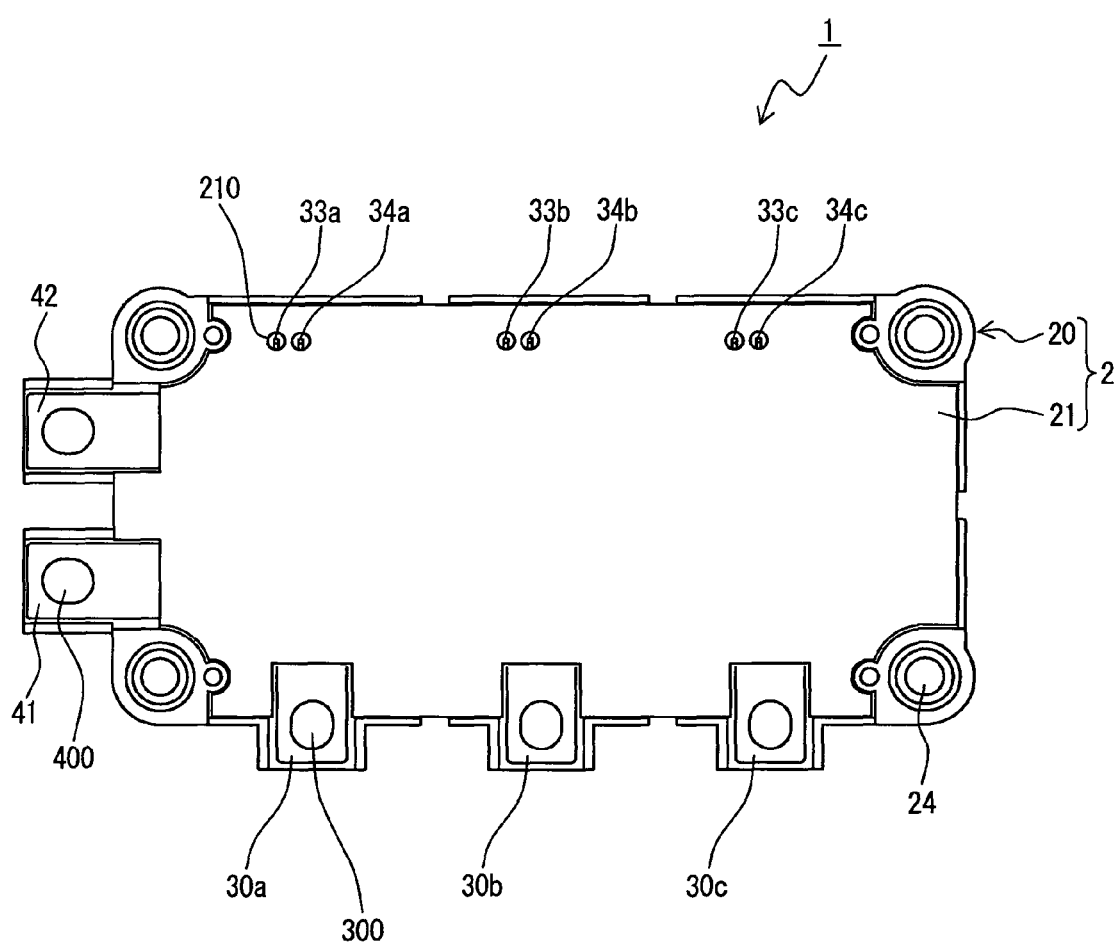

[Fig.2]
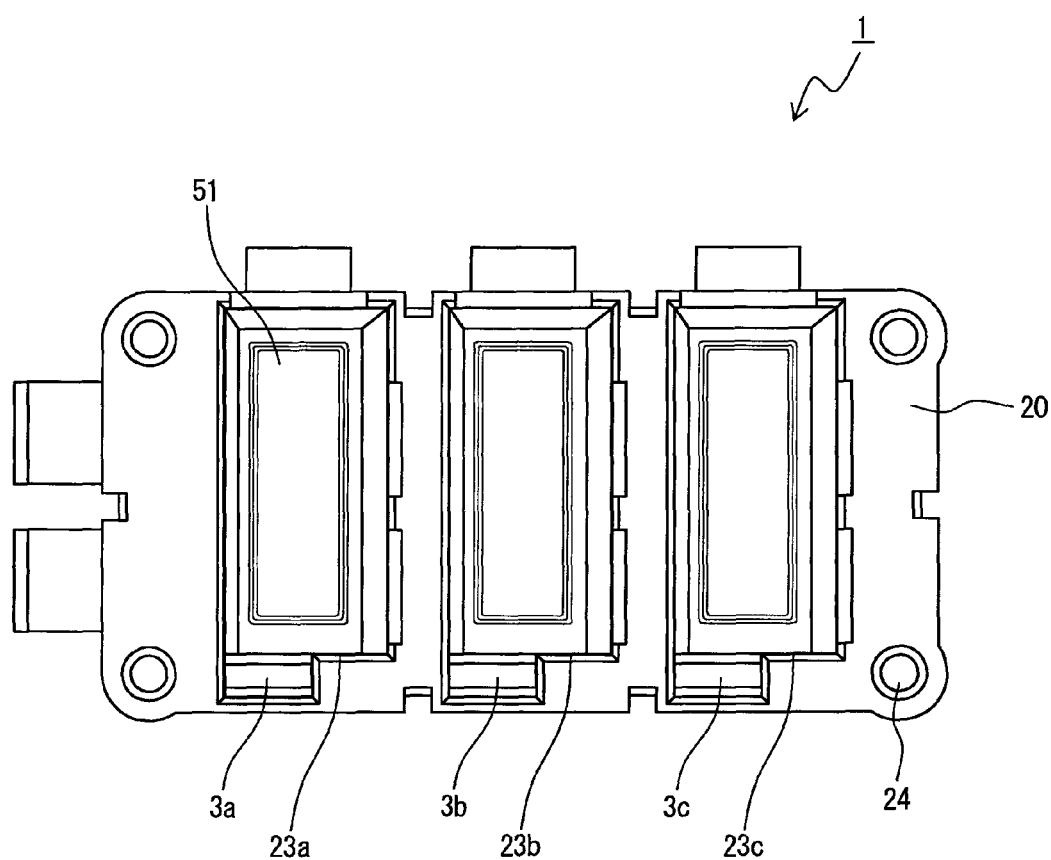

[Fig.3]
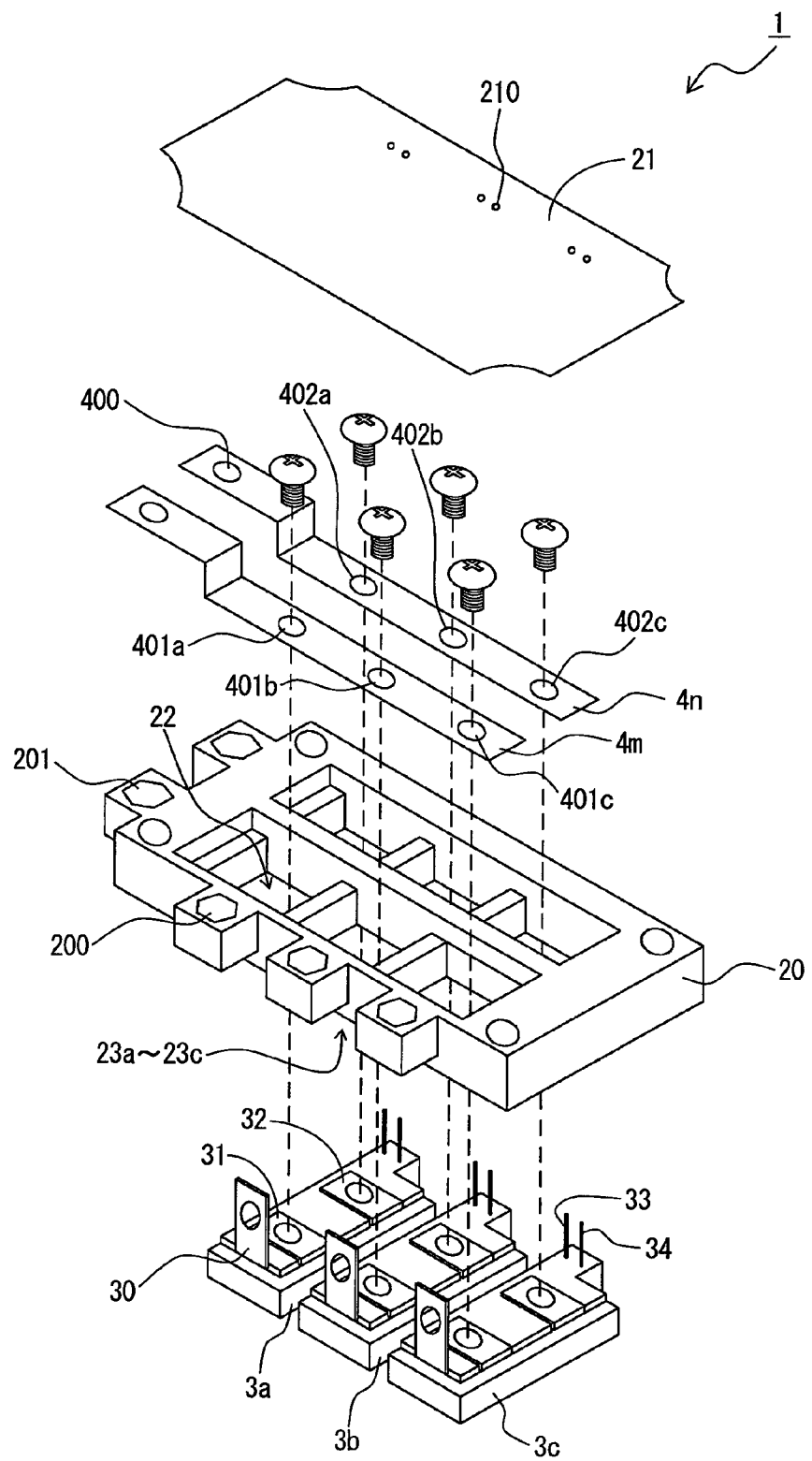

[Fig.4]
[Fig.4] (a)
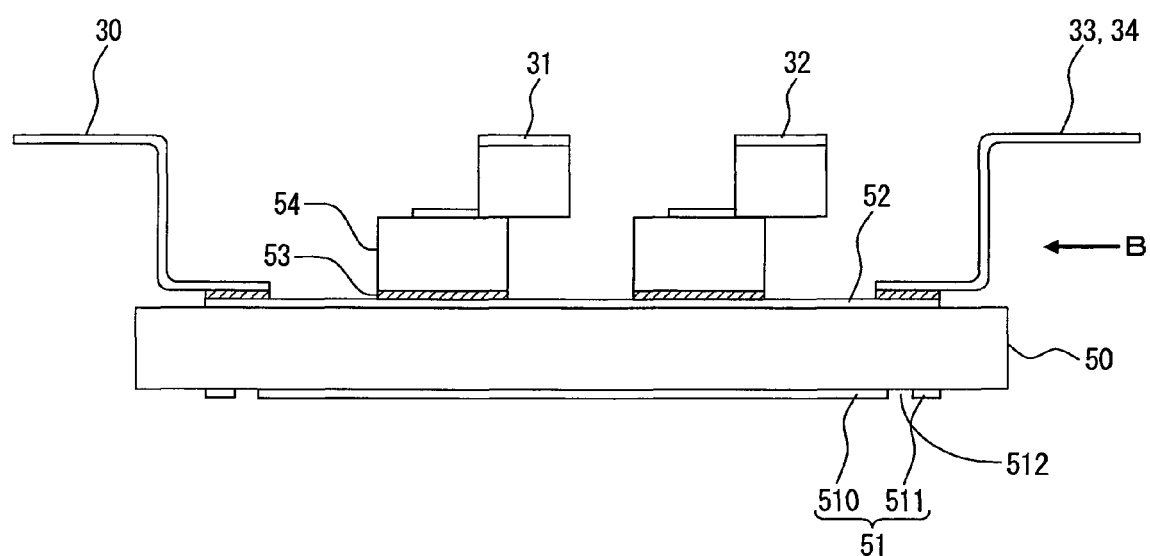
[Fig.4] (b)
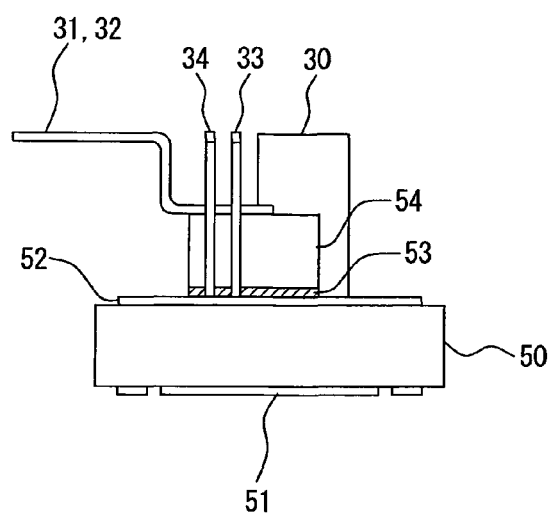

[Fig.5]
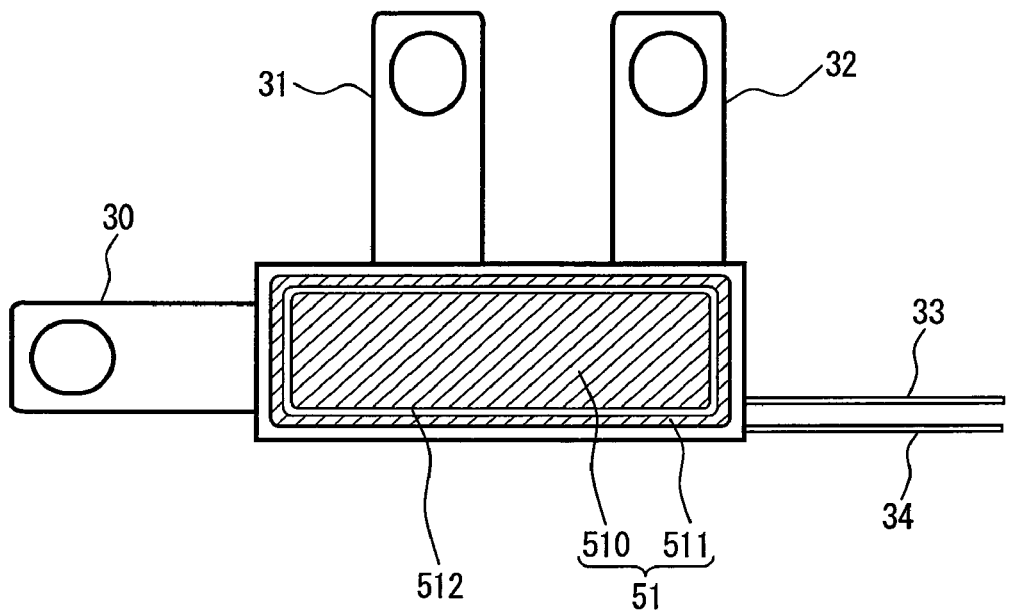

[Fig.6]
[Fig.6] (a)
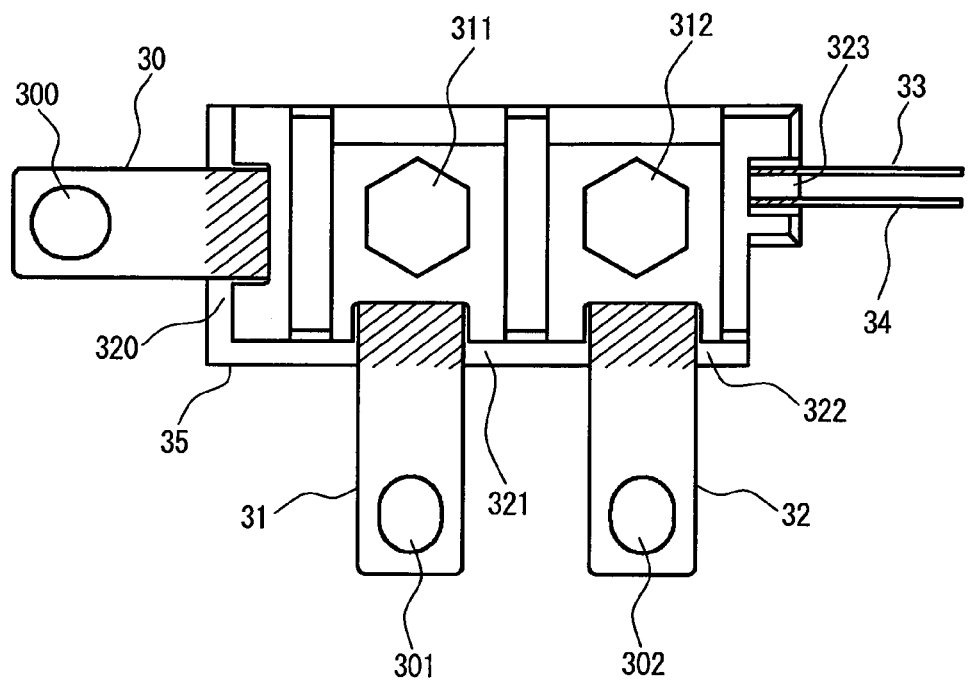
[Fig.6] (b)
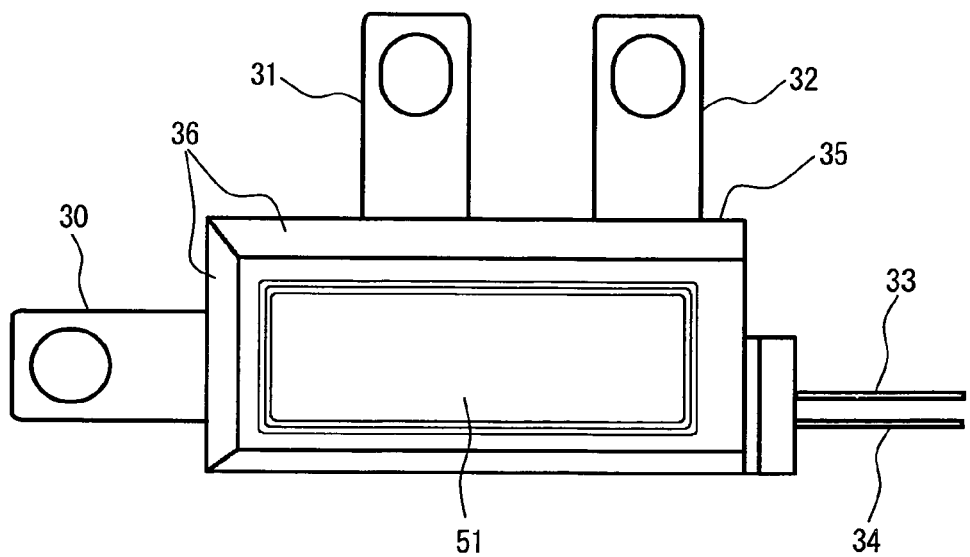

[Fig. 7]
[Fig. 7] (a)
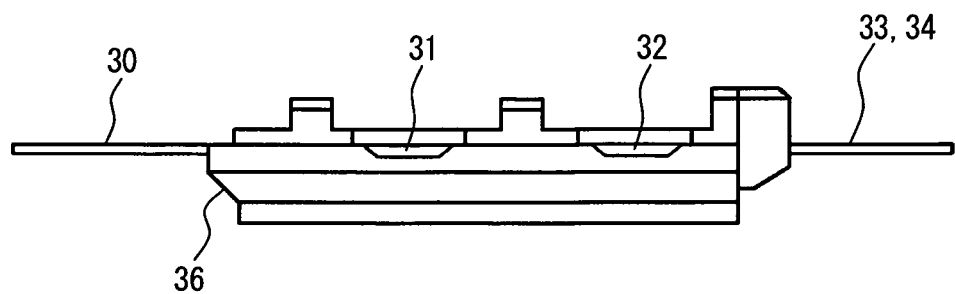
[Fig. 7] (b)
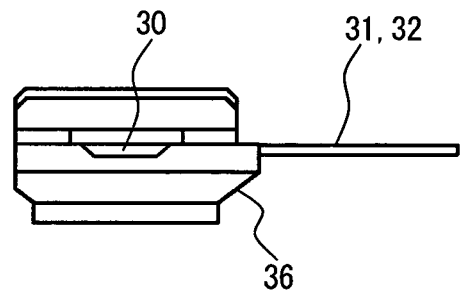
[Fig. 7] (c)
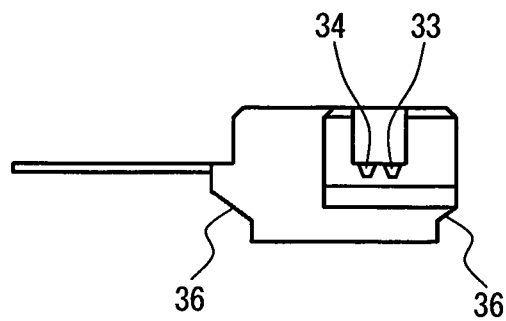

【Fig.8】
【Fig.8】(a)
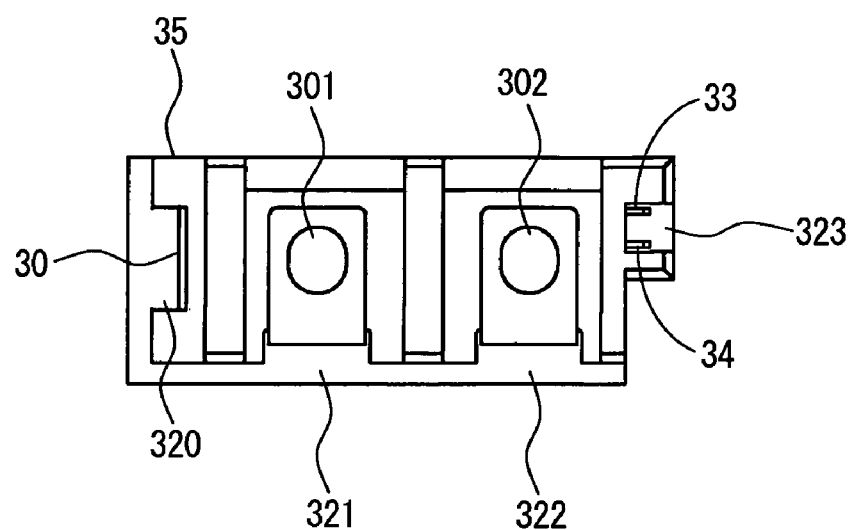
【Fig.8】(b)
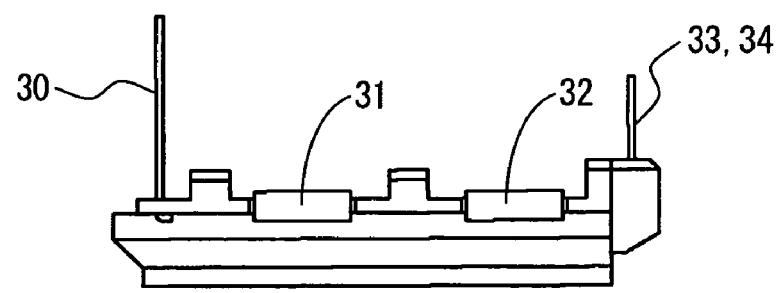

[Fig.9]
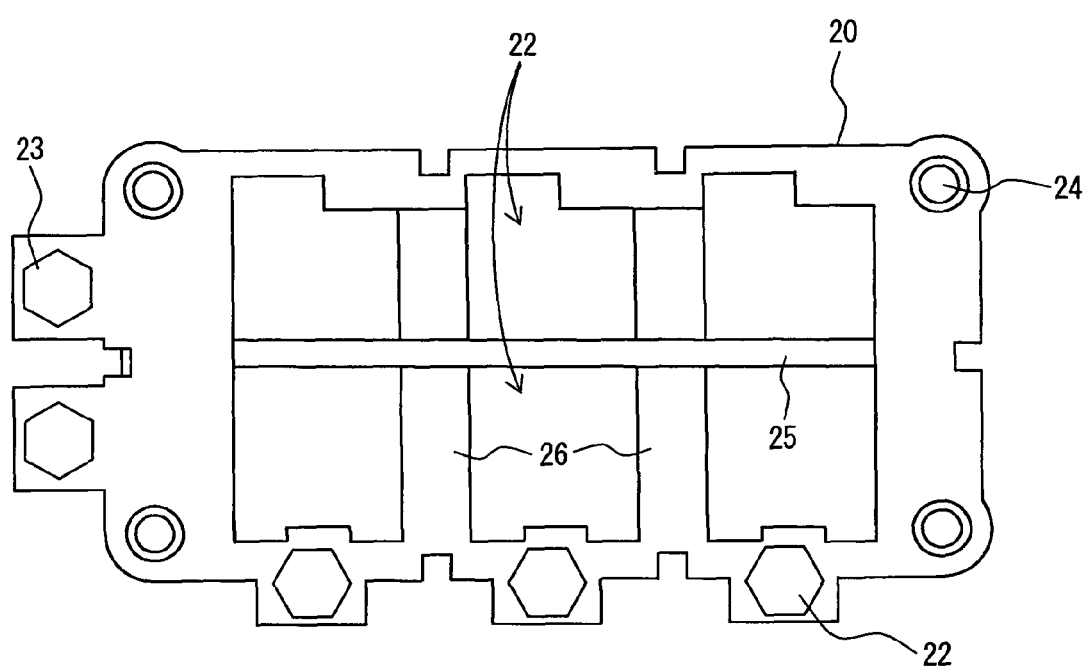

[Fig.10]
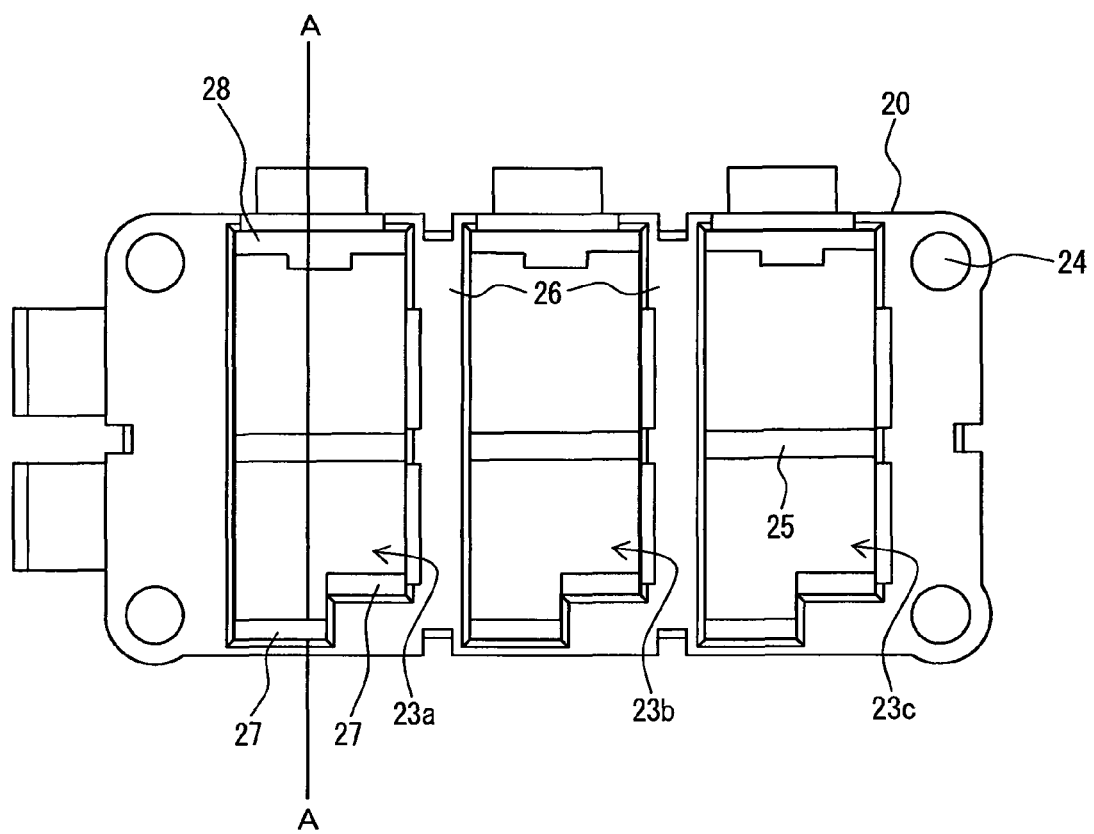

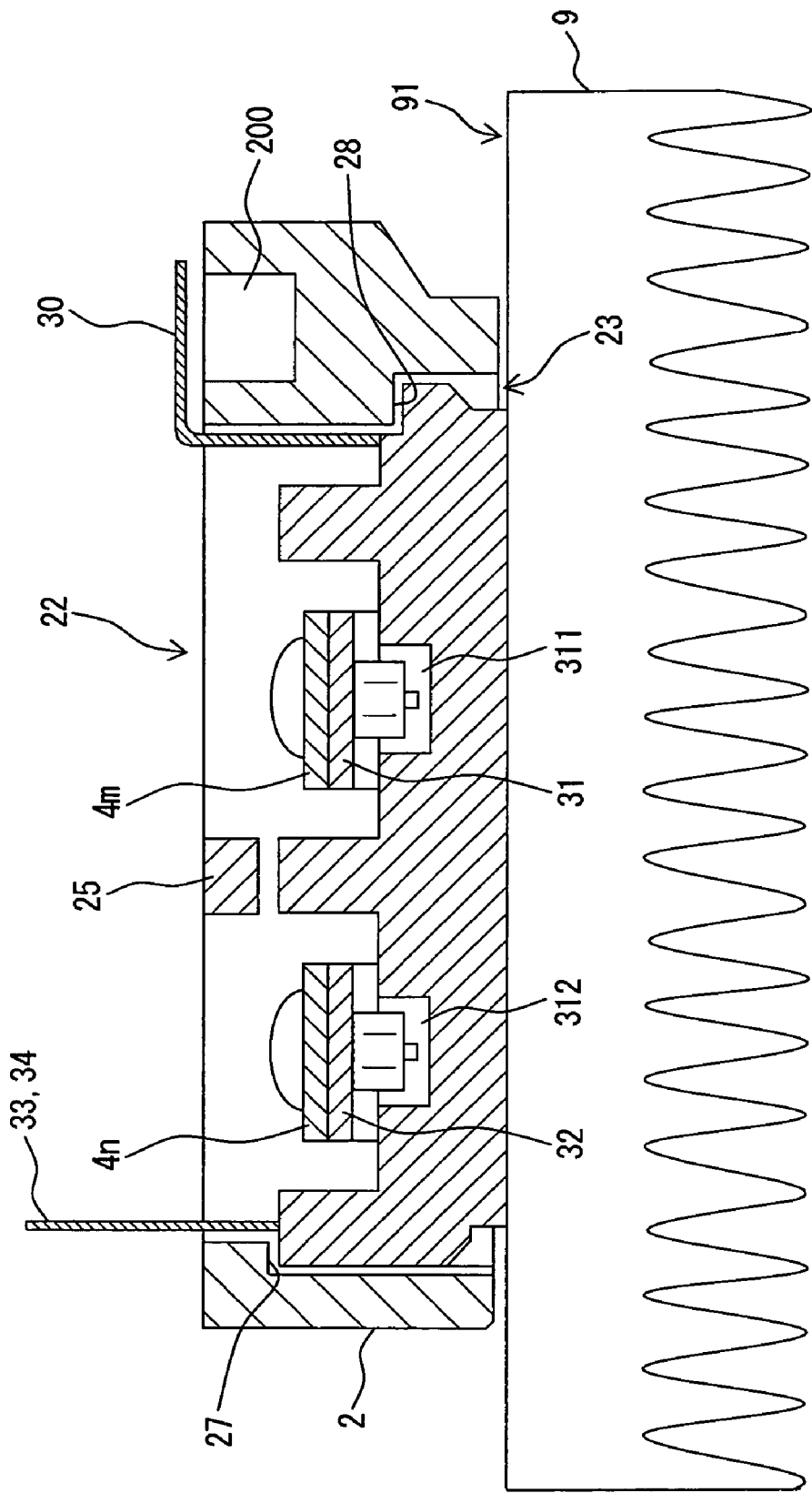
[Fig. 11]

[Fig.12]
[Fig.12](a)
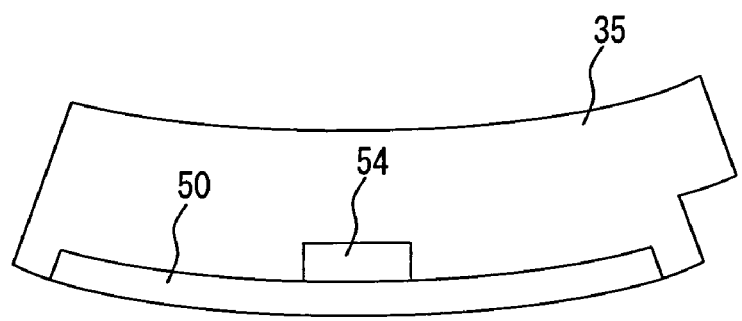
[Fig.12](b)
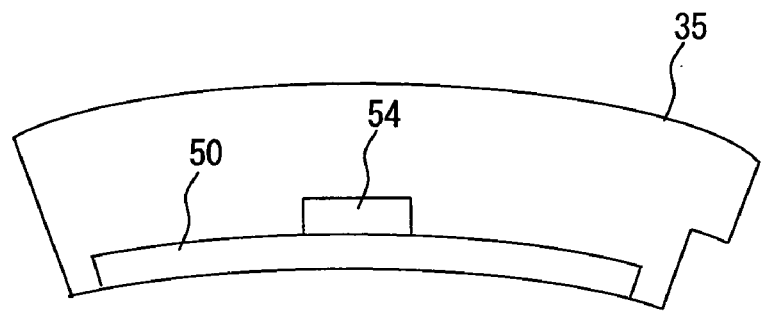

POWER SEMICONDUCTOR MODULE

TECHNICAL FIELD

The present invention relates to a power semiconductor module, and more particularly, to a power semiconductor module used for an electrical power converter such as a converter or inverter.

BACKGROUND ART

As a semiconductor module, there is known a device in which a semiconductor element used for an electrical power converter is sealed with resin and modularized. In this sort of semiconductor module, a chip arrangement surface of a ceramic substrate is sealed with resin, and heat is radiated from a back surface of the ceramic substrate. For this reason, if, due to a difference in a thermal expansion coefficient between the ceramic substrate and the resin, mold shrinkage of the resin, or warpage of the substrate caused by a heat cycle during operation occurs, the occurrence causes a reduction in radiation efficiency, or peeling-off of a semiconductor chip.

Because of this, in a typical semiconductor module, a ceramic substrate on which chip parts including a semiconductor chip are soldered is bonded onto a thick metal plate such as a copper (Cu) or iron (Fe) plate through a heat spreader or an insulating sheet. Also, a case for surrounding a chip mounting surface of the ceramic substrate is attached, into which silicon gel is injected to protect the chip parts, and then resin is further filled.

However, in the case where the silicone gel is used to protect the chip parts, moisture intruding from a gap of the case may adversely influence the chip parts. Also, electrical connections among the chip parts are made with wire bonding, soldering of a lead frame, or ultrasonic bonding; however, if a part of the bonding is deteriorated by heat or the like, the use of the silicone gel as a protecting material makes it difficult to stably fix the wire or lead frame.

For this reason, there has been proposed a semiconductor module in which resin is directly filled on a chip mounting surface of a ceramic substrate without use of the protecting material such as silicone gel (e.g., Patent document 1). In Patent document 1, the ceramic substrate is joined onto a metal plate to form a module substrate on which a semiconductor chip is mounted, and then the resin is injected into a space surrounded by an enclosing case, a frame body, and a module substrate. If the enclosing case has sufficient stiffness, stress due to mold shrinkage upon curing of the sealing resin can be dispersed into the module substrate and the frame body to prevent warpage of the module substrate, and therefore temperature cycle resistance can be improved.

Patent document 1; Japanese Unexamined Patent Publication No. 1997-237869

DISCLOSURE OF THE INVENTION

Problem to be Solved by the Invention

In a conventional semiconductor module, a ceramic substrate is bonded to a metal plate to thereby prevent warpage of the ceramic substrate and ensure a good radiation characteristic. However, in the case of using the metal plate, there exists a problem that a reduction in weight of the semiconductor module becomes difficult. For this reason, it is considered that a radiator is directly fitted onto a back surface of the ceramic substrate by employing a configuration in which the warpage of the ceramic substrate is unlikely to occur, and omitting the metal plate.

In this case, preferably, to prevent the warpage of the ceramic substrate as much as possible, by forming not only on a surface of the ceramic substrate a metal layer for mounting a semiconductor chip, but also a metal layer on a back surface of the ceramic substrate, which is brought into abutting contact with the radiator, a thermal expansion characteristic of the both surfaces of the ceramic substrate are made uniform.

In the case of forming the metal layers on the both surfaces of the ceramic substrate as described above, upon injection of resin onto the surface of the ceramic substrate after the mounting of the semiconductor chip on the surface of the ceramic substrate, to prevent the resin from flowing onto the metal layer on the back surface, the resin is injected with the back surface of the ceramic substrate being in close contact with a flat inner surface of a mold. However, even in the case of injecting the resin in this manner, a small amount of resin may intrude onto the metal layer on the back surface of the contact substrate. In the case where the resin having intruded onto the back surface of the contact substrate attaches onto the metal layer on the back surface, radiation efficiency is significantly reduced even if the amount is small.

The present invention is made in consideration of the above situations, and has an object to provide a power semiconductor module capable of suppressing warpage of a ceramic substrate, and preventing a reduction in radiation efficiency.

Means Adapted to Solve Problems

A power semiconductor module according to a first aspect of the present invention includes: a module casing fitted with a radiator; and a common unit retained by the module casing, and is configured such that the common unit has: a ceramic substrate having a circuit surface disposed with a semiconductor element, and a radiation surface brought into abutting contact with the radiator; and a package formed to expose the radiation surface and to seal the circuit surface with heat resistant resin, the circuit surface and the radiation surface are respectively formed of metal layers formed on the ceramic substrate, and the metal layer forming the radiation surface has: by forming a groove part extending along a circumferential part thereof, an inner pattern formed on an inner side of the groove part; and an outer pattern formed on an outer side of the groove part.

Based on such a configuration, the metal layers respectively forming the circuit surface and the radiation surface are formed on both surfaces of the ceramic substrate, and therefore a thermal expansion characteristic of the both surfaces of the ceramic substrate can be made uniform to thereby suppress warpage of the ceramic substrate. Also, between the inner pattern and the outer pattern, the groove part in which any metal layer is not formed is formed, so that even if there is a portion of the resin intruding onto the metal layer to pass through the outer pattern, the portion of the resin is accommodated in the groove part if the portion is small, and therefore does not spread on the inner pattern. For this reason, a reduction in radiation efficiency due to attachment of the resin onto a surface of the inner pattern can be prevented.

A power semiconductor module according to a second aspect of the present invention is, in addition to the above configuration, configured such that the groove part is annularly formed along the circumferential part of the metal layer, and thereby the outer pattern surrounds an outer circumference of the inner pattern.

Based on such a configuration, the outer pattern surrounds the outer circumference of the inner pattern with sandwiching the groove part, and therefore even if a portion of the resin intrudes from any part of the outer pattern, the portion of the resin can be well accommodated in the groove part. Accordingly, the reduction in radiation efficiency due to the attachment of the resin onto the surface of the inner pattern can be more effectively prevented.

Effect of the Invention

According to the present invention, thermal expansion characteristics of both surfaces of a ceramic substrate can be made uniform to suppress warpage of the ceramic substrate. Also, resin intruding onto a metal layer can be accommodated in a groove part, and therefore a reduction in radiation efficiency due to attachment of the resin onto a surface of an inner pattern can be prevented.

BEST MODE FOR CARRYING OUT THE INVENTION

FIGS. 1 and 2 are appearance diagrams illustrating one configuration example of a semiconductor module 1 according to an embodiment of the present invention, in which FIG. 1 illustrates a top surface, and FIG. 2 a bottom surface. FIG. 3 is a development perspective view illustrating an appearance upon assembly of the semiconductor module 1.

The semiconductor module 1 is a power semiconductor module intended to convert AC power and DC power with use of semiconductor elements such as a thyristor, diode, and bipolar transistor. In the present embodiment, as an example of such a power semiconductor module, there is described a module for achieving a bridge circuit with use of three thyristors and three diodes. Such a bridge circuit is widely used for a three-phase AC converter that full-wave rectifies a three-phase AC power supply to convert it into a DC power supply.

The semiconductor module 1 is configured to contain three common units 3 (3a to 3c) and two metal plates 4 (4m and 4n) in a module casing 2. The common units 3 are units all having a same configuration in which a series circuit of the thyristor and diode is incorporated, and can be interchanged for use. Note that, in the present description, components corresponding to one another in the three common units are denoted by the same reference numeral, and if specific components of the common units are referred to, symbols "a" to "c" are added to the above reference numeral.

The module casing 2 includes: a module main body 20 that is formed in a thin, substantial box shape, and made of resin; and a module lid 21 that is formed in a substantially rectangular plate-like body, and made of resin. The module main body 20 contains therein the three common units 3 and two metal plates 4, and has: a top surface opening 22 that opens throughout the top surface; and three bottom surface openings 23 (23a to 23c) that open into parts of the bottom surface. The top surface opening 22 is an opening for assembly, which is covered with the module lid 21 after the assembly, and the bottom surface openings 23a to 23c are openings for radiation, which respectively expose radiation surfaces of the common units 3a to 3c.

The bottom surface of the module casing 2 is a radiator fitting surface for assembling a radiator 9. The radiator 9 is a metal casing, radiation fins, or the like, of a device into which the semiconductor module 1 is incorporated, and fitted onto the module casing 2 with use of fitting holes 24 formed at four corners of the module casing 2. The radiation surfaces of the common units 3a to 3c are slightly projected from the bottom surface openings 23a to 23c formed in the radiator fitting surface, and by fitting the radiator onto the module casing 2, can be brought into close contact with the radiator 9.

On the other hand, a top surface of the module casing 2 is a terminal surface formed with terminals for connecting external wiring lines, and disposed with three external terminals 30 (30a to 30c), three sets control terminals 33 (33a to 33c) and 34 (34a to 34c), and external common terminals 41 and 42.

The external terminal 30 is a terminal of the common module 3, and the three external terminals 30a to 30c are arranged along one side of the module lid 21 at regular intervals. The external terminals 30a to 30c are metal plates that are drawn from gaps of the module main body 20 and module lid 21 on the top surface of the module casing 2, and folded so as to be parallel to the top surface of the module casing 2, and extend outward along the module main body 20, of which end parts are formed with fastening holes 300.

A top surface of the module main body 20 facing to the fastening holes 300 is formed with nut storage parts 200 that store metal nuts so as to prevent them from rotating, and by fastening screws inserted into the fastening holes 300 with the above nuts, the external terminals 30 and external wiring lines sandwiched between the above screws and nuts can be electrically conducted. Note that even if the above nuts are not fastened in the nut storage parts 200, openings of the nut storage parts 200 are covered with the external terminals 30 that are folded after the storage of the nuts, and therefore unless the common units 3 are removed, the nuts do not drop out of the nut storage parts 200 even when not fastened with the screws.

The external common terminal 41 is a terminal formed by drawing from the module casing 2 a part of the metal plate 4m that electrically conducts common terminals 31 of the respective common modules 3a to 3c to one another in the module casing 2, and placed on a side of the module lid 21 adjacent to the side along which the external terminals 30a to 30c are arranged. The external common terminal 41 is, similar to the external terminals 30, drawn from gaps of the module main body 20 and the module lid 21 on the top surface of the module casing 2, and extends outward along the module main body 20, of which an end part is formed with a fastening hole 400. The top surface of the module main body 20 facing to the fastening hole 400 is formed with a nut storage part 201 that stores a metal nut so as to prevent it from rotating, and by fastening a screw inserted into the fastening holes 400 with the above nut, the external common terminal 41 and the external wiring line sandwiched between the above screw and the nut can be electrically conducted. Note that even if the above nut is not fastened in the nut storage part 201, an opening of the nut storage part 201 is covered with the external common terminal 41 that is arranged after the storage of the nut, and therefore unless the metal plate 4m is removed, the nut does not drop out of the nut storage part 201 even when not fastened with the screw.

The external common terminal 42 is a terminal formed by drawing from the module casing 2 a part of the metal plate 4n that electrically conducts common terminals 32 of the respective common modules 3a to 3c to one another in the module casing 2. The rest of a configuration of the external common terminal 42 is exactly the same as that of the external common terminal 41.

The control terminals 33 and 34 are terminals of the common modules 3 (3a to 3c), and the three sets of two control terminals 33a to 33c and 34a to 34c are arranged along a side of the module lid 21 on a side opposite to the side along which the external terminals 30 are arranged. The control terminals 33 and 34 are pin-like terminals of which cross sections extending upward are substantially rectangular shaped, and drawn outside the module casing 2 through guide holes 210 of the module lid 21.

Next, with use of FIG. 3, an example of a method for assembling the semiconductor module 1 is described. The common unit 3 is incorporated in the module main body 20 from the bottom surface opening 23, and the external terminal 30 thereof is folded outward with the common unit 3 being inserted to an innermost position. If the three common units 3a to 3c are attached in this manner, they can be contained in the module main body 20 in a state where they are arrayed such that longer sides thereof face to each other at regular spaces.

The metal plates 4m and 4n are incorporated in the module main body 20 from the top surface opening 22. The metal plates 4m and 4n are arranged with intersecting with a longitudinal direction of the common unit 3 so as to respectively traverse all of the common units 3a to 3c. Also, the metal plate 4m is formed with three fastening holes 401a to 401c, and with use of screws, fastened with and electrically conducted to all of the common terminals 31 of the common modules 3. Similarly, the metal plate 4n is formed with three fastening holes 402a to 402c, and with use of screws, fastened with and electrically conducted to all of the common terminals 32 of the common modules 3. Subsequently, closing the top surface opening 22 with the module lid 21 completes the assembly of the semiconductor module 1.

FIG. 4 is a diagram illustrating one configuration example of an inside of the common module 3, in which (b) is a diagram as viewed from a direction B illustrated in (a). An upper surface of a ceramic substrate 50 is arranged with semiconductor elements 54 and the terminals 30 to 34, and used as a circuit surface for connecting them, whereas a lower surface of the ceramic substrate 50 is used as a radiation surface that is brought into close contact with a heat-transfer surface of the radiator 9.

The ceramic substrate 50 is a circuit board that is formed on the both surfaces thereof with metal layers 51 and 52, and for example, copper (Cu) thin plates are fixed by a DBC (Direct Bonding Copper) method. The metal layer 52 on a circuit surface side is patterned with use of a photolithography technique, and used as wiring. Also, by forming the metal layer 51 on a radiation surface side as well, a thermal expansion characteristic of the both surfaces of the ceramic substrate 50 are made uniform to suppress warpage of the ceramic substrate 50.

The semiconductor chips 54 are arranged on the metal layer 52 through a solder layer 53. We herein assume that, as the semiconductor chips 54, the thyristor and the diode connected to each other in series are arranged. Also, although omitted in the diagrams, the other electronic parts such as a chip resistor are arranged as necessary. Further, the respective terminals 30 to 34 are also disposed on the metal layer 52 through the solder layer 53, or on the semiconductor chips. Between these electronic parts and the respective terminals 30 to 34, electrical connections are made with use of the metal layer 52 pattern, bonding wires, or lead frame as necessary. Also, the respective terminals 30 to 34 are sandwiched between two molds during resin molding, and therefore folded so as to be parallel to the ceramic substrate 50 at positions of which heights from the ceramic substrate 50 are the same.

FIG. 5 is a diagram of the ceramic substrate 50 in FIG. 4 as viewed from a lower surface side. The metal layer 51 formed on the lower surface of the ceramic substrate 50 includes a rectangular shaped radiation pattern 510 having a large area, and an elongated outer circumferential pattern 511 surrounding the radiation pattern 510, and between the radiation pattern 510 and the outer circumferential pattern 511, there is formed a buffer pattern 512 in which the metal layer 51 is not formed. That is, the buffer pattern 512 is formed as an elongated groove part, for example, a groove part having a constant width, surrounding the radiation pattern 510 on an inner side of the outer circumferential pattern 511. For the formation of such a pattern, for example, a photolithography technique can be used.

Based on such a configuration, with respect to the buffer pattern 512 as the groove part extending along a circumferential part of the metal layer 52 on the radiation surface side, the radiation pattern 510 is formed inside the buffer pattern 512 as an inner pattern, and the outer circumferential pattern 511 is formed outside the buffer pattern 512 as an outer pattern.

Note that, in this example, there is illustrated a configuration in which along a circumferential part of the metal layer 52 on the radiation surface side, the annular buffer pattern 512 is formed along the circumferential part of the metal layer 52 on the radiation surface side such that the outer circumferential pattern 511 surrounds an outer circumference of the radiation pattern 510 with sandwiching the buffer patter 512; however, without limitation to such a configuration, there may be a configuration in which the buffer pattern 512 is formed along only a part of the circumferential part of the above metal layer 52. In this case, it is only necessary to have a configuration in which the groove part is formed along at least one side of the rectangular shaped metal layer 51, and in the case where the metal layer 51 is rectangular shaped, there may be a configuration in which the groove part is formed along any one of a pair of longer sides or a pair of shorter sides facing to each other.

The ceramic substrate 50 formed with the circuit is sealed by the resin with the metal layer 51 of the ceramic substrate 50, and the end sides of the respective terminals 30 to 34 being only unsealed. The sealing is performed by, for example, an RTM (Resin Transfer Molding) method using heat curable epoxy resin. On the basis of such resin molding processing, there is formed a package 35 in which the metal layer 51 is exposed, and the terminals 30 to 34 are projected. The resin molding processing is performed with the lower surface of the ceramic substrate 50 being in close contact with a flat inner surface of the mold to as to prevent the resin from flowing onto a surface of the metal layer 51. Also, the buffer pattern 512 is preliminarily formed, so that even if there exists a portion of the resin that intrudes onto the metal layer 51 and passes through the outer circumferential pattern 511, it is accommodated in the buffer pattern 512 as the groove if an amount of it is small, and therefore the resin does not spread on the radiation pattern 510. For this reason, a reduction in radiation efficiency due to attachment of the resin onto a surface of the radiation pattern 510 can be prevented.

In particular, in the present embodiment, the outer circumferential pattern 511 surrounds the outer circumference of the radiation pattern 510 with sandwiching the buffer pattern 512, and therefore even if the resin intrudes from any part of the outer circumferential pattern 511, the resin can be well accommodated in the buffer pattern 512. Accordingly, the reduction in radiation efficiency due to the attachment of the resin onto the surface of the radiation pattern 510 can be more effectively prevented.

FIGS. 6 and 7 are appearance diagrams illustrating one configuration example of the common unit 3 after the resin sealing, in which FIG. 6 (a) illustrates a top surface, and (b) a bottom surface. Also, FIG. 7 (a) illustrates a side surface as viewed from a common terminals 31 and 32 side, (b) a side surface as viewed from an external terminal 30 side, and (c) a side surface as viewed from the control terminals 33 and 34 side, respectively.

FIG. 8 is an appearance diagram illustrating one configuration example of the common unit 3 before the common unit 3 is contained in a module casing 2, in which a state where the respective terminals 30 to 34 are folded is illustrated. In addition, in the diagram, (a) illustrates a top surface, and (b) a side surface as viewed from the common terminals 31 and 32 side. The external terminal 30 and the control terminals 33 and 34 are orthogonally folded, and face upward, and the common terminals 31 and 32 are folded at an angle of 180 degrees, and extend along a top surface of the middle of the package 35.

The respective terminals 30 to 34 after the resin sealing are all exposed outside the package 35 from valley lines of step parts opening upward, in the example illustrated in the diagram, from deepest parts of concave portions on the package 35 formed by the top surface and the side surfaces, and extend outward along the top surface of the package 35. Applying upward force to ends of these terminals 30 to 34 to fold the terminals 30 to 34 at around the above valley lines results in a shape illustrated in FIG. 8. In this case, a below folded part of the respective terminals 30 to 34, top surfaces 320 to 323 extending outward are formed, and these surfaces function as insulating walls. That is, by folding the terminals 30 to 34 at positions receding from edge parts of the package 35, the projecting portions 320 to 323 of the package can be formed below the terminals 30 to 34 to elongate creepage distances from the radiator 9 to the terminals 30 to 34, and therefore insulation properties can be improved.

Note that, in FIG. 6 (a), hatched base parts of the respective terminals 30 to 34 are formed so as to be embedded in the top surfaces 320 to 323 of the package with only top surfaces thereof being exposed. Such a configuration can be achieved if the resin molding processing is performed with the respective terminals 30 to 34 being in close contact to the inner surface of the mold for forming the top surfaces 320 to 323 of the package.

If, upon folding of the terminals 30 to 34, the terminals 30 to 34 and the top surfaces 320 to 323 cannot be easily separated from each other, the package 35 cracks, or the terminals 30 to 34 are folded outside the valley lines, resulting in a reduction in quality of the common unit 3. For this reason, the cross sections of the terminals 30 to 34 are formed in a shape that facilitates peeling off from the top surfaces 310 to 313, i.e., a shape in which a width becomes narrower as it goes downward. Specifically, side surfaces of the terminals 30 to 34 are tapered, and thereby the cross sections of the terminals 30 to 34 are formed in a trapezoidal shape that widens upward. Any shape other than the trapezoidal shape is possible if the shape has a cross section of which a width widens upward, such as a triangular or semicircular shape. Also, the top surfaces of the terminals 30 to 34 are exposed surfaces from the top surfaces 320 to 323, and are therefore desirably plain surfaces. In addition, it goes without saying that the portions separated from at least the top surfaces 320 to 323 desirably have such a cross-sectional shape.

An end part of the common terminal 31 is formed with a fastening hole 301 for fastening the metal plate 4m. On the top surface of the package 35 facing to the fastening hole 301, a nut storage part 311 that stores a metal nut so as to prevent it from rotating is formed as a concave portion. Accordingly, by fastening a screw inserted into the fastening hole 301 and the fastening hole 401 of the metal plate 4m with the above nut, the common terminals 31 and the metal plate 4m sandwiched between the above screw and nut can be electrically conducted. Note that even if the above nut is not fastened in the nut storage part 311, an opening of the nut storage parts 311 is covered with the common terminal 31 that is folded after the storage of the nut, and therefore the nut does not drop out of the nut storage part 311 even when not fastened with the screw.

In exactly the same manner, an end part of the common terminal 32 is formed with a fastening hole 302 for fastening the metal plate 4n. On the top surface of the package 35 facing to the fastening hole 302, a nut storage part 312 that stores a metal nut so as to prevent it from rotating is formed as a concave portion. Accordingly, by fastening a screw inserted into the fastening hole 302 and the fastening hole 402 of the metal plate 4n with the above nut, the common terminal 32 and metal plate 4n sandwiched between the above screw and the nut can be electrically conducted. Note that even if the above nut is not fastened in the nut storage part 312, an opening of the nut storage part 312 is covered with the common terminal 32 that is folded after the storage of the nut, and therefore the nut does not drop out of the nut storage part 312 even when not fastened with the screw.

Also, the package 35 is formed in a thin, substantially rectangular shape, and side surfaces of the package 35 are provided with tapered parts 36, which makes an outer shape of the package 35 larger toward a top surface side, as compared with that of the bottom surface on which the radiation surface is formed. Also, on the top surface of the package, the nut storage holes 311 and 312 are formed as the concave portions, and in the portions, a resin layer is formed thin. Accordingly, the stress acting on the ceramic substrate 50 due to mold shrinkage of the resin is suppressed, and therefore the warpage of the ceramic substrate 50 can be reduced.

FIGS. 9 and 10 are appearance diagrams only illustrating the module main body 20 of FIG. 1, in which FIG. 9 illustrates the top surface, and FIG. 10 the bottom surface. In an internal space of the module main body 20, one reinforced beam 25 on a top surface side, which traverses the common units 3a to 3c, and two reinforced beams 26 on a bottom surface side, which intersect with the reinforced beam 25, are formed. The reinforced beam 25 is arranged further above the common units 3a to 3c, whereas the reinforced beams 26 are formed between adjacent two of the respective common units 3a to 3c, and position the common units 3 in a horizontal plane.

Unit abutting contact parts 27 and 28 are projecting portions formed on an inner wall of the module main body 20 or step parts opening downward, and brought into abutting contact with both longitudinal ends of the common unit 3 to thereby position the common module 3 in a vertical direction.

FIG. 11 is a cross-sectional diagram for a case where the semiconductor module 1 fitted with the radiator 9 is cut along a section line A-A in FIG. 10. When the fitting holes 24 are used to fit the radiator 9 onto the module casing 2, the radiator fitting surface of the module casing 2 and the flat heat-transfer surface 91 of the radiator 9 can be made to face to each other, and brought into a state where the both are as close to each other as possible. At this time, the common unit 3 is retained by the module casing 2 such that the radiation surface thereof is slightly projected from the bottom surface opening 23 of the module casing 2, and therefore sandwiched between the unit abutting contact parts 27 and 28 and the heat-transfer surface 91 of the radiator. For this reason, the radiation surface of the common unit 3 can be brought into close contact with the heat-transfer surface 91 of the radiator 9.

FIG. 12 is an explanatory diagram illustrating an example for a case where warpage occurs in the ceramic substrate 50. The package 35 made of the resin has a large thermal expansion coefficient as compared with the ceramic substrate 50. For this reason, upon cooling after the resin molding processing, the package 35 more largely shrinks as compared with the ceramic substrate 50, and therefore downward convex warpage is likely to occur in the ceramic substrate 50, which is referred to as "positive warpage". On the other hand, upward convex warpage of the ceramic substrate 50 is referred to as "negative warpage". From the perspective of radiation efficiency, the occurrence of the warpage is not desirable, and in particular, in the case of the negative warpage, because the middle part of which a temperature is increased is not brought into close contact with the radiation plate, the radiation efficiency is significantly poor as compared with the case of the positive warpage.

In the semiconductor module 1 in FIG. 1, the three common units 3a to 3c are arrayed in the substantially rectangular module casing 2, and therefore a temperature of the central common unit 3b is further increased as compared with the common units 3a and 3c on both sides. On the other hand, the radiator 9 is fitted with use of the fitting holes 24 provided at the four corners of the module casing 2, and therefore as compared with the common units 3a and 3c on the both sides, pressing force of the radiator 9 on the radiation surface 51 of the central common unit 3b is small, which is likely to cause poor radiation efficiency. Accordingly, for the central common unit 3b, the ceramic substrate 50 having a more positive warpage property is desirably used as compared with the common units 3a and 3c on the both sides. In particular, the ceramic substrate 50 of the central common unit 3b desirably has a positive warpage property.

Note that, in the above embodiment, the metal plates 4m and 4n are used to respectively connect the common terminals 31 and 32 of the respective common units 3a to 3c in the module casing 2; however, the present invention is not limited to such a case. That is, instead of the metal plates 4n and 4m, a metal block having an arbitrary shape can be used.

Also, in the above embodiment, there is described the example where the common unit 3 includes the thyristor and the diode; however, the present invention is not limited to such a case. That is, the common unit 3 can include a combination of a diode, a thyristor, a bipolar transistor, and any other power semiconductor element. For example, the common unit 3 may include a series circuit of two thyristors. Also, the present invention is not limited to a case where the common unit 3 includes two semiconductor elements.

Further, in the present embodiment, there is described the example of the three-phase AC converter in which the semiconductor module 1 converts the three-phase AC power into the DC power; however, the present invention is not limited to such a case. For example, the present invention can also be used for an inverter that converts a DC power into an AC power, or the other power converter.

Still further, in the present embodiment, there is described the example of the semiconductor module 1 that contains the three common units 3 in the module casing 2; however, a module casing containing only one common unit 3 can be achieved. In this case, the metal plates 4m and 4n become unnecessary. The common unit 3 can be made common to semiconductor modules respectively containing different numbers of common units 3 in this manner, and therefor cost can be further reduced.

BRIEF DESCRIPTION OF THE DRAWINGS

FIG. 1 is an appearance diagram illustrating one configuration example of a semiconductor module 1 according to an embodiment of the present invention, in which a top surface of the semiconductor module 1 is illustrated.

FIG. 2 is an appearance diagram illustrating the one configuration example of the semiconductor module 1, in which a bottom surface of the semiconductor module 1 is illustrated.

FIG. 3 is a development perspective view illustrating an appearance upon assembly of the semiconductor module 1 of FIG. 1.

FIG. 4 is a diagram illustrating one configuration example of an inside of a common module 3.

FIG. 5 is a diagram of a ceramic substrate 50 in FIG. 4 as viewed from a lower surface side.

FIG. 6 is an appearance diagram illustrating one configuration example of the common unit 3 after resin sealing, in which a top surface and a bottom surface of the common unit 3 are illustrated.

FIG. 7 is an appearance diagram illustrating the one configuration example of the common unit 3 after the resin sealing, in which respective side surfaces of the common unit 3 are illustrated.

FIG. 8 is an appearance diagram illustrating one configuration example of the common unit 3 before the common unit 3 is contained in a module casing 2.

FIG. 9 is an appearance diagram only illustrating a module main body 20 of FIG. 1, in which a top surface of the module main body 20 is illustrated.

FIG. 10 is an appearance diagram only illustrating the module main body 20 of FIG. 1, in which a bottom surface of the module main body 20 is illustrated.

FIG. 11 is a cross-sectional diagram for a case where the semiconductor module 1 fitted with a radiator 9 is cut along a section line A-A in FIG. 10.

FIG. 12 is an explanatory diagram illustrating an example for a case where warpage occurs in the ceramic substrate 50.

What is claimed is:

1. A power semiconductor module comprising:
   a module casing fitted with a radiator; and
   a common unit retained by said module casing, wherein
   said common unit has: a ceramic substrate having a circuit surface disposed with a semiconductor element, and a radiation surface brought into abutting contact with said radiator; and
   a package formed to expose said radiation surface and to seal said circuit surface with heat resistant resin,
   said circuit surface and said radiation surface are respectively formed of metal layers formed on said ceramic substrate, and
   said metal layer forming said radiation surface has: by forming a groove part extending along a circumferential part thereof, an inner pattern formed on an inner side of said groove part; and an outer pattern formed on an outer side of said groove part.

2. The power semiconductor module according to claim 1, wherein said groove part is annularly formed along the circumferential part of said metal layer, and thereby said outer pattern surrounds an outer circumference of said inner pattern.

* * * * *